US008854124B2

(12) United States Patent
Chung

(10) Patent No.: US 8,854,124 B2
(45) Date of Patent: Oct. 7, 2014

(54) ENVELOPE DETECTOR

(75) Inventor: Tae-Jin Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 65 days.

(21) Appl. No.: 13/613,335

(22) Filed: Sep. 13, 2012

(65) Prior Publication Data

US 2013/0113551 A1    May 9, 2013

(30) Foreign Application Priority Data

Nov. 7, 2011  (KR) ........................ 10-2011-0115414

(51) Int. Cl.
*H03D 1/00* (2006.01)
*H03D 1/10* (2006.01)
*H04L 27/06* (2006.01)

(52) U.S. Cl.
CPC *H03D 1/10* (2013.01); *H04L 27/06* (2013.01); *H03D 2200/0023* (2013.01); *H03D 2200/0066* (2013.01)
USPC ........... 329/347; 375/316; 455/337; 455/326; 455/313

(58) Field of Classification Search
USPC ................... 329/304, 347, 369, 370; 381/15; 455/150.1, 337, 326, 313; 375/316
See application file for complete search history.

(56) References Cited

U.S. PATENT DOCUMENTS

| 4,307,347 | A | | 12/1981 | Thomson | |
|---|---|---|---|---|---|
| 5,563,550 | A | * | 10/1996 | Toth | 329/347 |
| 7,639,821 | B2 | * | 12/2009 | Zinser | 381/15 |
| 7,821,581 | B2 | | 10/2010 | Vorenkamp | |
| 2006/0121871 | A1 | | 6/2006 | Kim | |
| 2009/0322312 | A1 | | 12/2009 | Arnborg | |

FOREIGN PATENT DOCUMENTS

| EP | 1 841 058 A1 | 3/2007 |
|---|---|---|
| JP | 2003-309777 | 10/2003 |
| KR | 10-2006-0063305 | 6/2006 |
| KR | 10-2008-0015343 | 2/2008 |

OTHER PUBLICATIONS

Yozo Shoji et al., Millimeter-Wave Remote Self-Heterodyne System for Extremely Stable and Low-Cost Broad-Band Signal Transmission, IEEE Transactions on Microwave Theory and Techniques, Jun. 2002, vol. 50, No. 6, pp. 1458-1468, Institute of Electrical and Electronics Engineers, New York, NY, ETATS-UNIS.
P. Kolinko et al., Passive RF Receiver Design for Wireless Sensor Networks, IEEE MTT-S International Microwave Symposium, Jun. 3-8, 2007, pp. 567-570, California Univ., San Diego, Conference Publications, Date of Conference: Jun. 3-8, 2007.

* cited by examiner

*Primary Examiner* — Arnold Kinkead
(74) *Attorney, Agent, or Firm* — William Park & Associates Patent Ltd.

(57) ABSTRACT

The envelope detector for detecting an envelope of a digital modulation signal in accordance with an embodiment of the present invention, includes: a mixer configured to receive the digital modulation signal and output a square signal squaring the digital modulation signal when being applied with bias voltage; a bias voltage applying unit configured to apply the bias voltage to the mixer; and a DC blocking capacitor configured to be connected to the mixer to block DC component included in the square signal. In accordance with the embodiment of the present invention, it is possible to provide the envelope detector having the simple structure while having the good receiving sensitivity and the wide dynamic range characteristics and detect the envelope of the modulated signal without transmitting the carrier signal in the transmitter and generating the separate signal in the receiver, thereby saving the costs consumed to implement the transceiver.

5 Claims, 8 Drawing Sheets

ENVELOPE DETECTOR

CROSS-REFERENCE TO RELATED APPLICATIONS

The present application claims priority of Korean Patent Application No. 10-2011-0115414, filed on Nov. 7, 2011, which is incorporated herein by reference in its entirety.

BACKGROUND OF THE INVENTION

1. Field of the Invention

Exemplary embodiments of the present invention relate to an envelope detector, and more particularly, to an envelope detector detecting an envelope of a digital modulation signal.

2. Description of Related Art

A wireless communication system using an RF signal is configured to include a transmitter and a receiver. The transmitter modulates a digital signal to be transmitted into the RF signal and transmits the modulated RF signal to the receiver and the receiver receives the RF signal and recovers the received RF signal into an original digital signal.

Hereinafter, referring to FIG. 1, a signal processing process in a generally used heterodyne receiver will be described below. The RF signal received through a receiving antenna 100 is input to an RF terminal of a mixer 130 through a band pass filter (BPF) 110 and a low noise amplifier 120. The RF signal is mixed with a signal from a local oscillator 135 in the mixer 130 and is frequency-down-converted into an intermediate frequency (IF) band that is a difference between a frequency of the RF signal and a frequency of an LO signal. The IF signal passes through the band pass filter 140 and the amplifier 150 and is then input to an envelope detector 160. The envelope detector 160 detects a power level of an input signal input to the envelope detector 160 and an envelope of a modulated signal. A low pass filter 170 removes harmonic component of the signal output from the envelope detector 160. Meanwhile, the signal passing through the low pass filter 170 is recovered to an original digital signal through a decision circuit and amplifier 180.

In the signal processing process as described above, the envelope detector 160 may detect the envelope of the modulated signal in various types according to a modulation type of a transmitted modulation signal.

Hereinafter, an envelope detection method will be described with reference to FIGS. 2 to 4. As illustrated in FIG. 2, a detector 200 is a simplest and frequently used detector that is configured to include a diode 210, a capacitor 230, and a resistor 250. The detector 200 illustrated in FIG. 2 has a disadvantage in that detection sensitivity is relatively low.

A detector 300 illustrated in FIG. 3, which is an ASK envelope detector, detects an envelope using a mixer 310. The mixer 310 used for envelope detection includes both of a passive mixer using a diode that is a passive device and an active mixer using a field effect transistor (FET) or a bipolar junction transistor (BJT) that is an active device. When the envelope is detected using the mixer 310, a local oscillator 350 generates a sine wave having the same frequency and phase as a carrier and inputs the generated sine wave to the mixer 310. The sine wave generated from the local oscillator 350 is multiplied by a modulated signal input to the mixer 310, such that a baseband signal and a frequency component having a frequency twice higher than a carrier frequency are output from the mixer 310. The type is a coherent detection type, wherein the coherent detection type has advantages in that detection sensitivity characteristics are excellent and a dynamic range is wide. Meanwhile, for the coherent detection, the frequency and phase input to an input terminal 330 of the mixer is the same as the frequency and phase of the signal from the local oscillator 350 and therefore, the coherent problem is not easy.

A detector 400 illustrated in FIG. 4 uses a type similar to FIG. 3, but in order to solve the coherent problem between the input signal and the signal from the local oscillator, the local oscillator is not separately used and the input signal is branched and used. The input signal is input to an input terminal 430 and at the same time, is input to the mixer 410 using an amplifier chain 450, and as a result, the same effect as using the local oscillator 350 of FIG. 3 can be obtained.

Both of the detectors 300 and 400 illustrated in FIGS. 3 and 4 are similar to each other in that signal power different from the input signal is supplied to one terminal of the mixer and include the local oscillator 350 or the amplifier chain 450, thereby causing a problem of increasing a volume of the receiver and increasing manufacturing costs of the receiver.

SUMMARY OF THE INVENTION

An embodiment of the present invention is directed to an envelope detector having a simple structure while having good receiving sensitivity and wide dynamic range characteristics.

Further, an embodiment of the present invention is directed to an envelope detector capable of detecting an envelope of a modulated signal without transmitting a carrier signal in a transmitter and generating a separate signal in a receiver, thereby saving costs consumed to implement a transceiver.

The foregoing and other objects, features, aspects and advantages of the present invention will be understood and become more apparent from the following detailed description of the present invention. Also, it can be easily understood that the objects and advantages of the present invention can be realized by the units and combinations thereof recited in the claims.

An envelope detector for detecting an envelope of a digital modulation signal, includes: a mixer configured to receive the digital modulation signal and output a square signal squaring the digital modulation signal when being applied with bias voltage; a bias voltage applying unit configured to apply the bias voltage to the mixer; and a DC blocking capacitor configured to be connected to the mixer to block DC component included in the square signal.

DESCRIPTION OF SPECIFIC EMBODIMENTS

Figure 1:
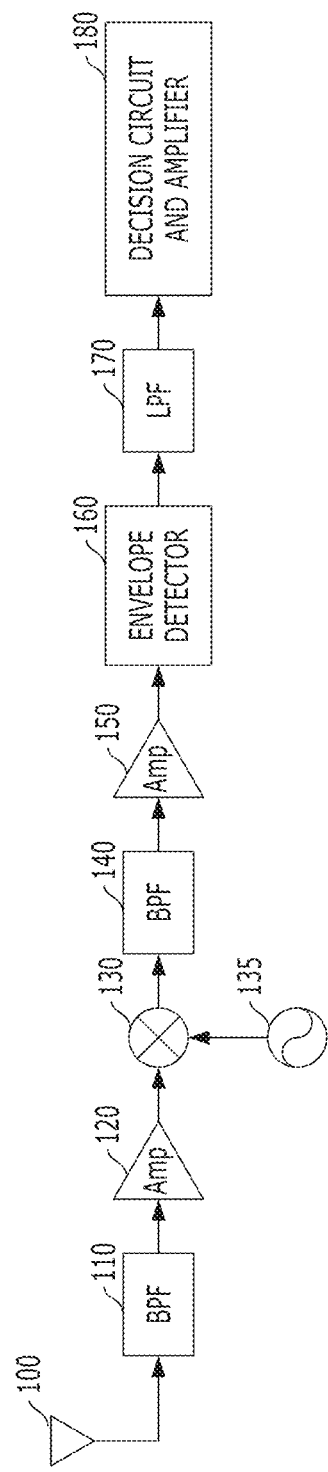
FIG. 1 is a block diagram illustrating a configuration of a general heterodyne receiver.
Figure 2:
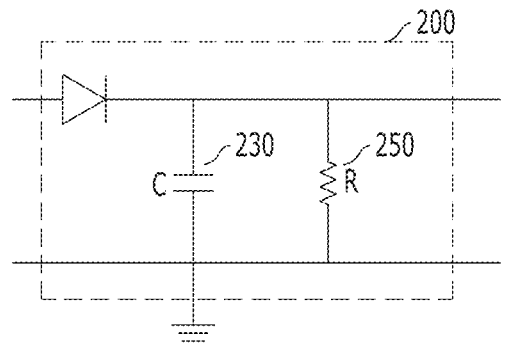
FIG. 2 is an envelope detector circuit using a single diode in accordance with the related art.
Figure 3:
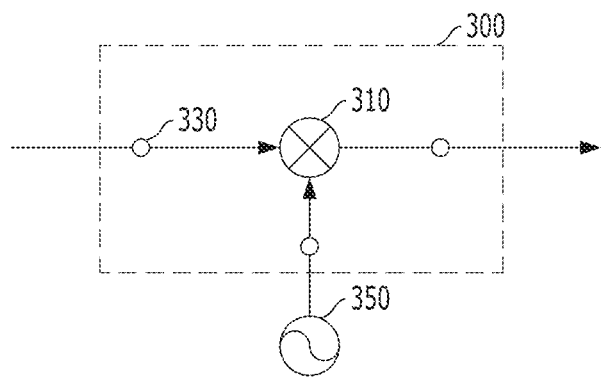
FIG. 3 is a configuration diagram of a coherent envelope detector using an external local oscillator and a mixer.
Figure 4:
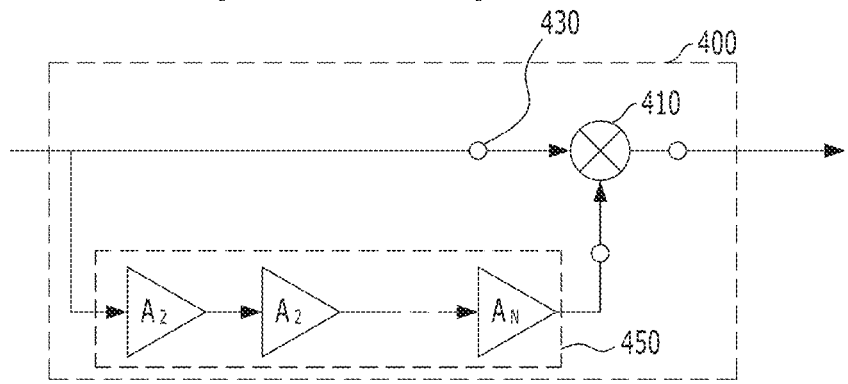
FIG. 4 is a configuration diagram of an envelope detector using an amplifier chain and a double balanced mixer in accordance with the related art.

The above-mentioned objects, features, and advantages will be described in detail with reference to the accompanying drawings. Therefore, exemplary embodiments will be described in detail with reference to the accompanying drawings so that they can be easily practiced by those skilled in the art to which the present invention pertains. Further, when it is determined that the detailed description of the known art related to the present invention may obscure the gist of the present invention, the detailed description thereof will be omitted. Hereinafter, preferred embodiments of the present invention will be described in detail with reference to the accompanying drawings. In the drawings, like reference numerals denote like or similar functions in various aspects.

Figure 5:
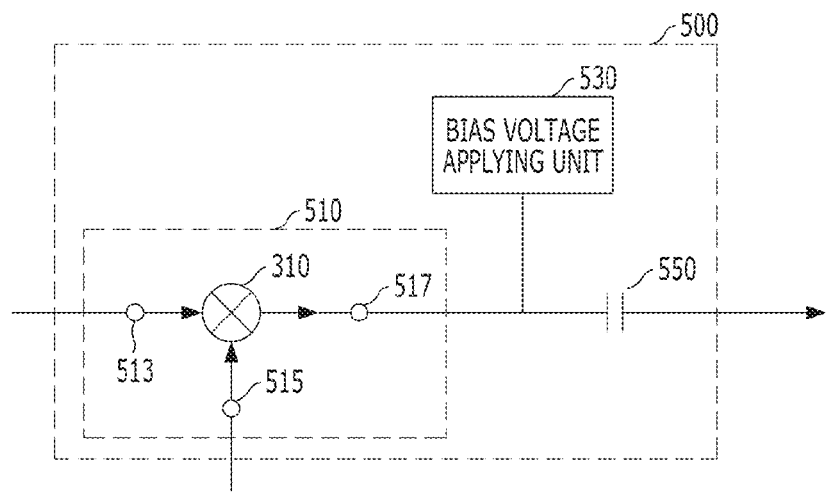
FIG. 5 is a configuration diagram of an envelope detector in accordance with an embodiment of the present invention.

FIG. 5 is a configuration diagram of an envelope detector in accordance with an embodiment of the present invention.

Referring to FIG. 5, an envelope detector 500 in accordance with an embodiment of the present invention may include a mixer 510, a bias voltage applying unit 530, and a DC blocking capacitor 550.

The mixer 510 receives a digital modulation signal and outputs a square signal squaring the digital modulation signal when being applied with bias voltage. As the mixer 510, the diode double balanced mixer may be used, but the present invention is not limited thereto. In addition, the mixer 510 may include a first terminal 513 that receives the digital modulation signal, a second terminal 515 that is connected to a ground through a resistor or opened, and a third terminal 517 that outputs the square signal when being applied with the bias voltage.

The digital modulation signal means a digital modulation signal according to a modulation type defined in the transmitter and is a signal having any carrier frequency. In addition, the digital modulation signal is generally subjected to the signal processing process as described in FIG. 1 before the digital modulation signal is input to the envelope detector 500 and therefore, the signal input to the mixer 510 of the envelope detector 500 may be preferably the IF signal that is frequency-converted into the intermediate frequency band.

The square signal output from the mixer 510, which is a signal squaring the digital modulation signal, means a sum of the baseband signal and a high frequency signal having a frequency twice higher than that of the carrier and may include DC component due to the internal and external effects of the mixer 510. The square signal will be described with reference to Equation.

For example, provided that there is no noise in the ASK modulated signal, an ASK modulated signal s (t) may be represented as follows.

$$S(t)=A[\cos(2\pi ft+\phi)] \qquad \text{[Equation 1]}$$

In this case, squaring the modulated signal input to the mixer 510 is represented as follows.

$$S2(t) = A2[\cos(2\pi ft+\phi)][\cos(2\pi ft+\phi)] \qquad \text{[Equation 2]}$$
$$= A2/2 + 1/2 \cos2(2\pi ft+\phi)$$

Therefore, referring to the above Equations, it can be confirmed that the signal squaring the modulated signal is represented by a sum of the baseband signal and the high frequency signal having a frequency twice higher than that of the carrier, excepting for the included DC component due to the internal and external effects of the mixer 510.

The mixer in accordance with the related art generally has one input terminal receiving the modulated signal and the other input terminal receiving a sinusoidal signal having the same frequency as the carrier of the modulated signal. However, in the embodiment of the present invention, only one of two input terminals receives the digital modulation signal. The other terminal is opened or as illustrated in the drawings, is connected to the ground through the resistor and therefore, the signal is not input to the corresponding terminal. Therefore, the embodiment of the present invention can detect the envelope without the local oscillator or the amplifier chain included in the envelope detector and therefore, can implement the envelope detector having the simple structure and save the costs consumed to implement the envelope detector.

The bias voltage applying unit 530 applies the bias voltage to the mixer 510. The bias voltage applying unit 530 is connected to the third terminal of the mixer 510 to apply the bias voltage to the mixer 510. The bias voltage applied to the mixer 510 serves to turn-on the diode of the mixer when the mixer 510 is the diode double balanced mixer. Therefore, when the bias voltage is applied, the third terminal of the mixer outputs the square signal squaring the input digital modulation signal. The detailed contents of the operation of the inside of the mixer outputting the square signal will be described in more detail with reference to FIGS. 11 to 16.

The DC blocking capacitor 550 is connected to the mixer 510 to block the DC component included in the square signal. In addition to the signal mathematically squaring the digital modulation signal, the square signal may include the DC component by the bias voltage and a DC offset generated by the mixer 510 itself. Herein, the DC blocking capacitor 550 removes the components. Therefore, the signal passing through the DC blocking capacitor 550 will be a sum of the baseband signal and the high frequency signal having a frequency twice higher than that of the carrier.

Figure 6:
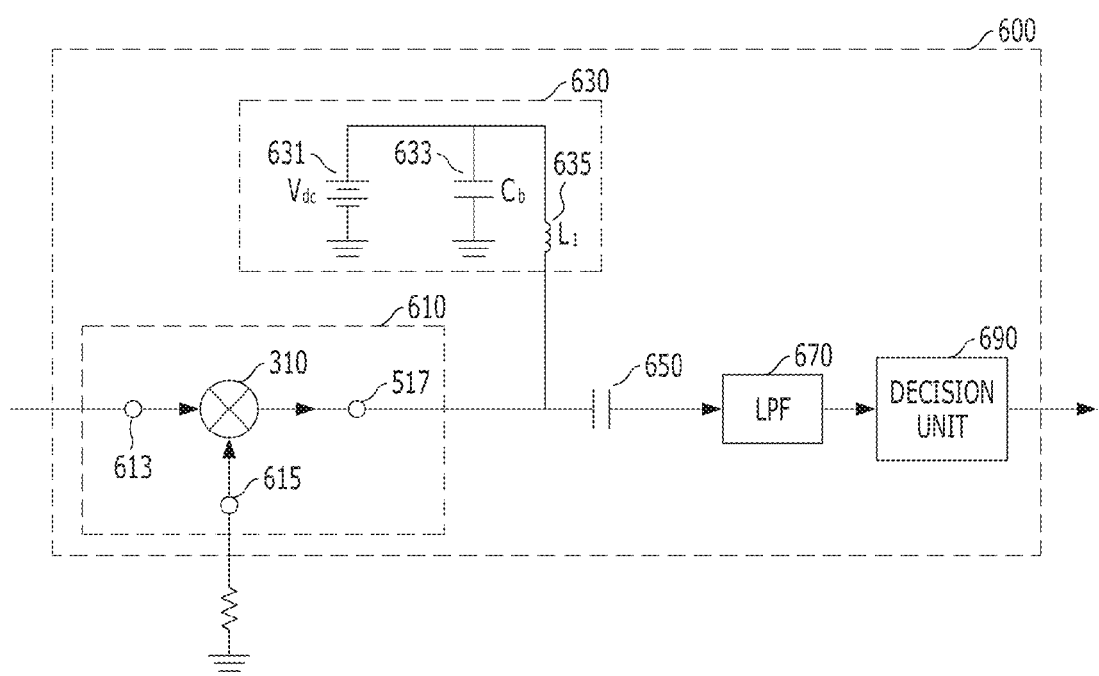
FIG. 6 is a configuration diagram illustrating in more detail the envelope detector in accordance with the embodiment of the present invention.

FIG. 6 is a configuration diagram illustrating in more detail the envelope detector in accordance with the embodiment of the present invention.

Referring to FIG. 6, an envelope detector 600 in accordance with an embodiment of the present invention may include a mixer 610 including a first terminal, a second terminal, and a third terminal, a bias voltage applying unit 630, and a DC blocking capacitor 650 and may further include a low pass filter 670 and a decision unit 690.

The mixer 610 receives a digital modulation signal and squares the digital modulation signal when being applied with bias voltage. A first terminal 613 of the mixer 610 receives the digital modulation signal and the second terminal 615 thereof may be connected to the ground through the resistor and may be opened as illustrated in FIG. 6. Further, a third terminal 617 thereof outputs the square signal when being applied with the bias voltage. As the mixer 610, the diode double balanced mixer may be used, but the present invention is not limited thereto.

The bias voltage applying unit 630 in accordance with the embodiment of the present invention includes a power supply unit 631, a capacitor 633, and a choke coil 635.

The power supply unit 631 supplies DC power to the third terminal of the mixer and the capacitor 633 removes harmonic waves generated at the time of supplying DC voltage, such that DC voltage may be applied to the mixer 610 without noise.

The choke coil 635, which is a coil preventing noise component from being introduced at the time of applying power, removes the noise component using a change in inductance due to a change in magnetic flux. The capacitor 633 and the choke coil 635 serve to increase stability at the time of applying the bias voltage and may also be replaced with other devices having the same function.

The DC blocking capacitor 650 is connected to the third terminal to block the DC component included in the square signal output from the third terminal and pass through only DC signal component. In addition, the DC voltage applied from the voltage applying unit 630 may be input to the mixer 610 without being lost.

The envelope detector 600 in accordance with the embodiment of the present invention may further include the low pass filter 670. The low pass filter 670 receives the square signal of which the DC component is blocked and removes the high frequency component of the square signal of which the DC component is blocked. As described above, the signal passing through the DC blocking capacitor 650 is a sum of the baseband signal and the high frequency signal and therefore, when the signal passes through the low pass filter 670, only the baseband signal remains, such that the envelope of the modulated signal may be defected from the baseband signal.

The envelope detector 600 in accordance with the embodiment of the present invention may further include the low pass filter 670. The low pass filter 670 receives the square signal of which the DC component is blocked and removes the high frequency component of the square signal of which the DC component is blocked. As described above, the signal passing through the DC blocking capacitor 650 is a sum of the baseband signal and the high frequency signal and therefore, when the signal passes through the low pass filter 670, only the baseband signal remains, such that the envelope of the modulated signal may be detected from the baseband signal.

Hereinafter, referring to FIGS. 7 to 10, a process of detecting the envelope of the modulated signal in accordance with the embodiment of the present invention will be described below.

Figure 7:
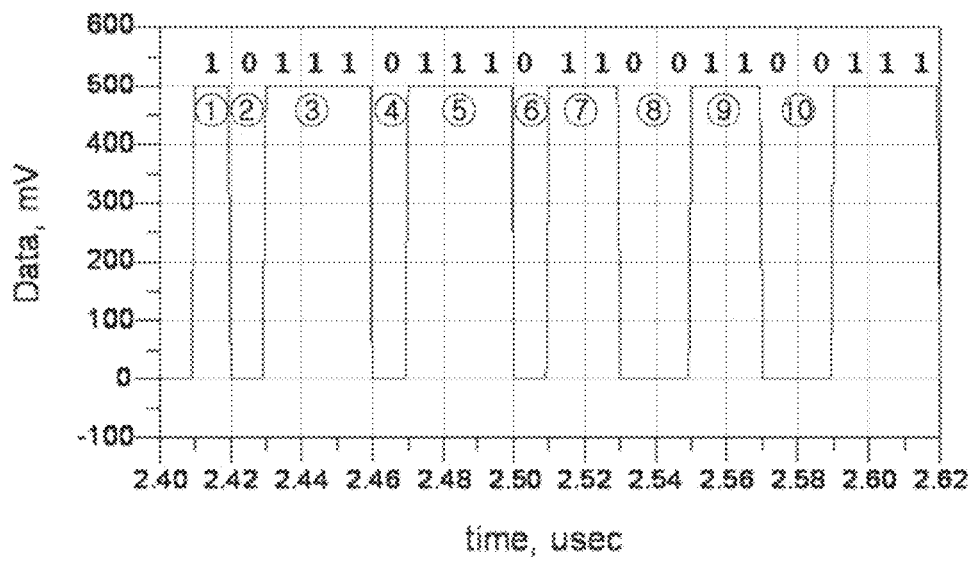
FIG. 7 is a graph illustrating a waveform of a data signal in a non-return-to-zero (NRZ) type for generating an ASK modulated signal.

FIG. 7 is a graph illustrating a waveform of a data signal in the non-return-to-zero (NRZ) type for generating the ASK modulated signal. Binary data to be transmitted have a [1 0 1 1 1 0 1 1 1 0 1 1 0 0 1 1 0 0 1 1 1] value as marked on the graph.

Figure 8:
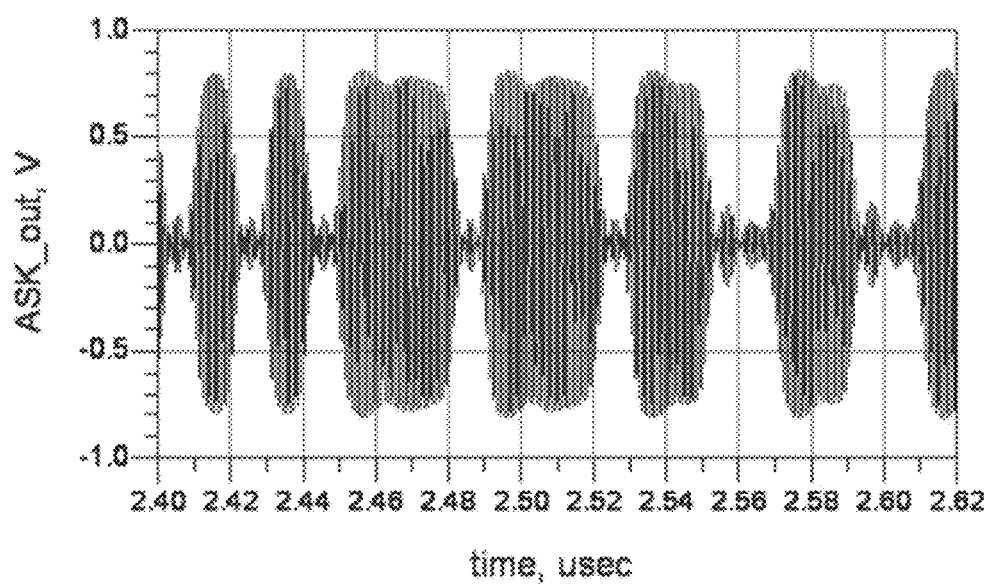
FIG. 8 is a graph illustrating a waveform of the ASK modulated signal that is modulated by a carrier.

FIG. 8 is a graph illustrating a waveform of the ASK modulated signal that is modulated by the carrier. An amplitude of the ASK modulated signal corresponds to a bit stream to be transmitted and the carrier frequency is carried within the envelope of the ASK modulated signal. The embodiment of the present invention receives the modulated signal as illustrated in FIG. 8 to detect the envelope.

Figure 9:
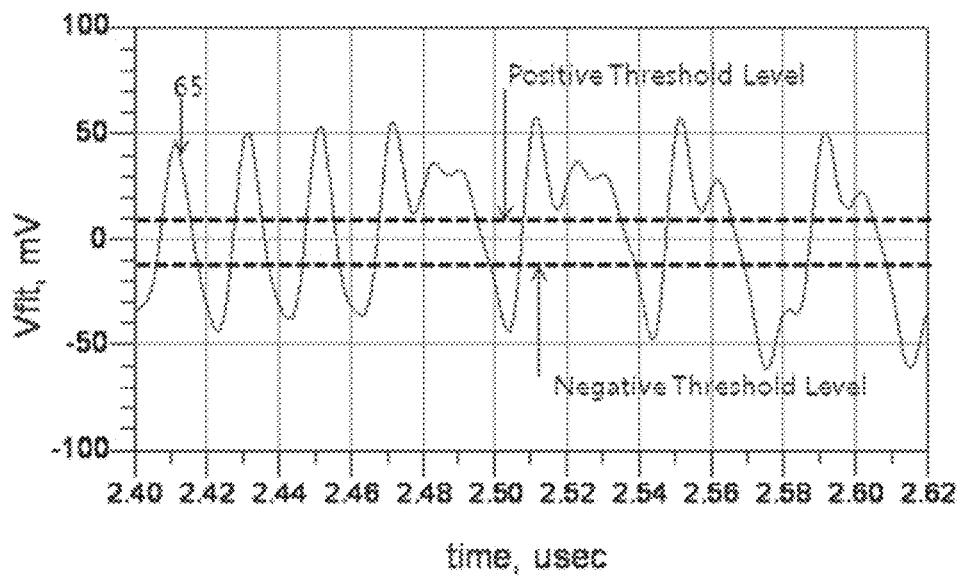
FIG. 9 is a graph illustrating a waveform of a signal passing through a low pass filter included in the envelope detector in accordance with the embodiment of the present invention.

FIG. 9 is a graph illustrating a waveform of a signal passing through the low pass filter included in the envelope detector in accordance with the embodiment of the present invention. The signal illustrated in FIG. 8 is the waveform of the ASK modulated signal passing through the mixer, the DC blocking capacitor, and the low pass filter. That is, the signal illustrated in FIG. 8 corresponds to the baseband signal in which the high frequency component having a frequency twice higher than that of the carrier is removed from the square signal of which the bias voltage and the DC offset of the mixer are removed.

Figure 10:
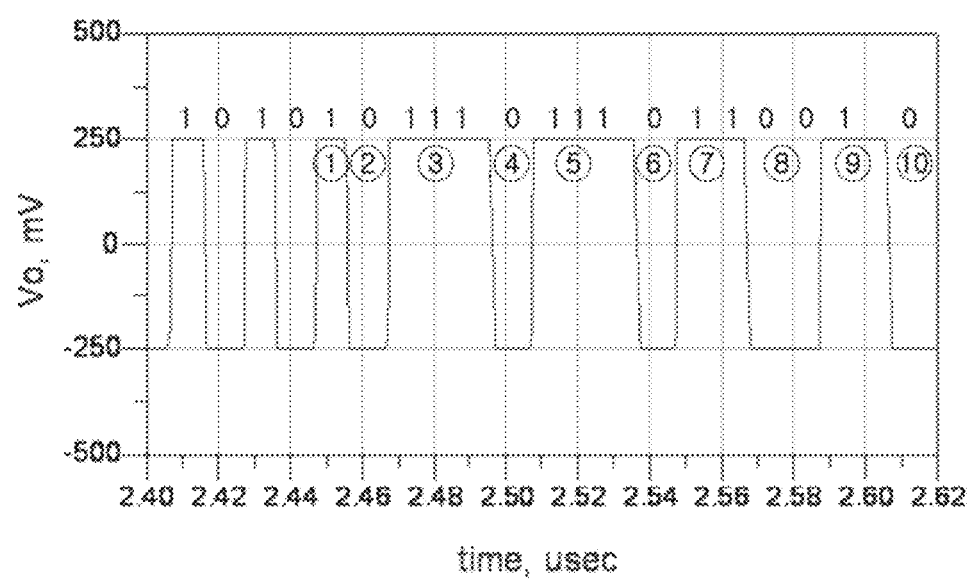
FIG. 10 is a graph illustrating a waveform of a signal passing through a decision unit included in the envelope detector in accordance with the embodiment of the present invention.

FIG. 10 is a graph illustrating a waveform of a signal passing through the decision unit included in the envelope detector in accordance with the embodiment of the present invention. The decision unit decides the symbol of the information using the positive (+) threshold level and the negative (−) threshold level illustrated in FIG. 9. As the decision results, the recovered digital signal is as illustrated in FIG. 10. However, the bit stream illustrated in FIG. 10 is [1 0 1 0 1 0 1 1 1 0 1 1 1 0 1 1 0 0 1 1 0]. When comparing with a bit stream at the time of transmission, the bit stream is delayed by bout 0.04 [μsec] (the envelope of FIG. 9 has a similar delay). However, when comparing a sequential number to with FIG. 7 that is the transmitting signal in consideration of the delay in the envelope detector, it can be confirmed that the envelope of the input modulated signal is accurately detected and the transmitting signal is also accurately recovered.

Figure 11:
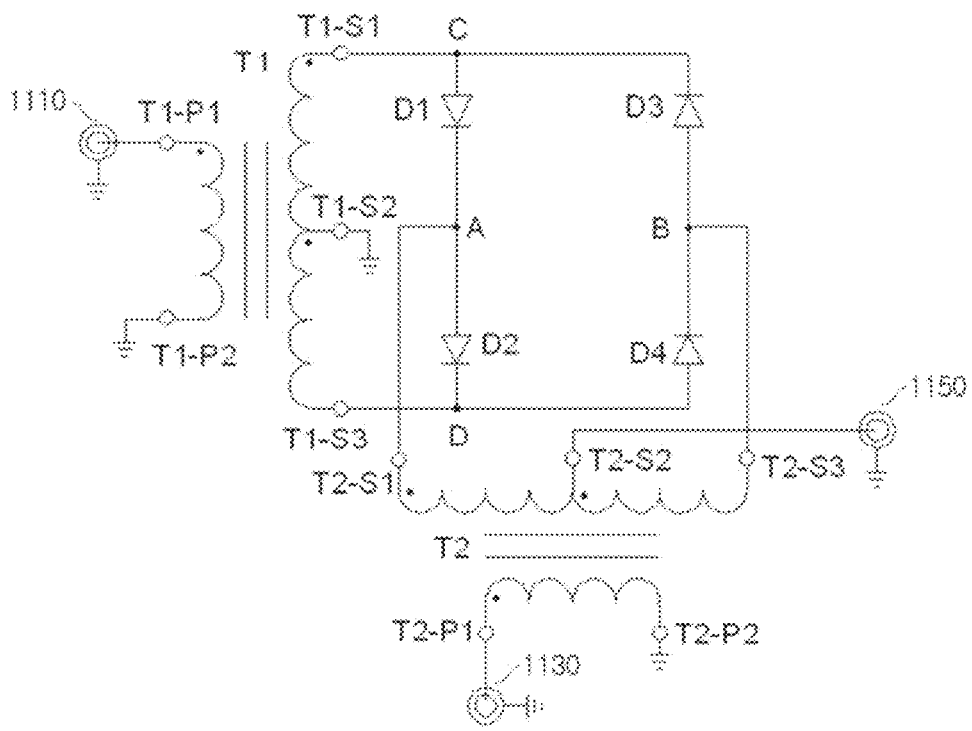
FIG. 11 is a circuit diagram illustrating a diode double balanced mixer used for the embodiment of the present invention.

FIG. 11 is a circuit diagram illustrating the diode double balanced mixer used for the embodiment of the present invention. Referring to FIG. 11, the diode double balanced mixer includes a first terminal 1110, a second terminal 1130, and a third terminal 1150 and is configured to include transformers represented by T1 and T2 and four diodes represented by D1 to D4. In this case, the digital modulation signal may be input to the first terminal 1110 and may also be input to the second terminal 1130. The remaining terminal to which the digital modulation signal is not input among two terminals may be connected to the ground through the resistor or may be opened. The bias voltage is applied to the third terminal 1150 and when the bias voltage is applied from the outside, the square signal may be output through the third terminal 1150.

Hereinafter, referring to FIGS. 11 to 15, an operation of the mixer will be described with reference to the embodiment in the case in which a sine wave of 1 GHz that is not modulated is applied to the first terminal 1110.

Figure 12:
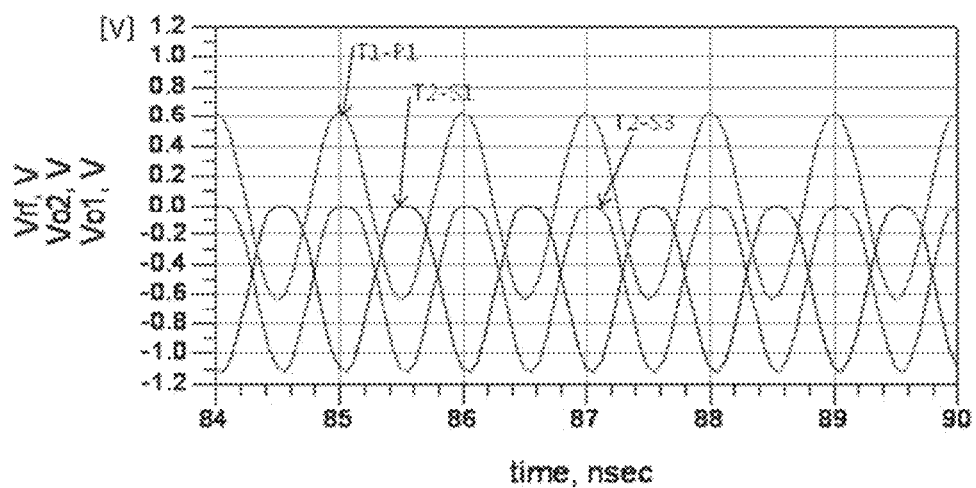
FIGS. 12 and 13 are graphs illustrating a waveform of a signal measured at an internal terminal of the diode double balanced mixer in accordance with the embodiment of the present invention.
Figure 13:
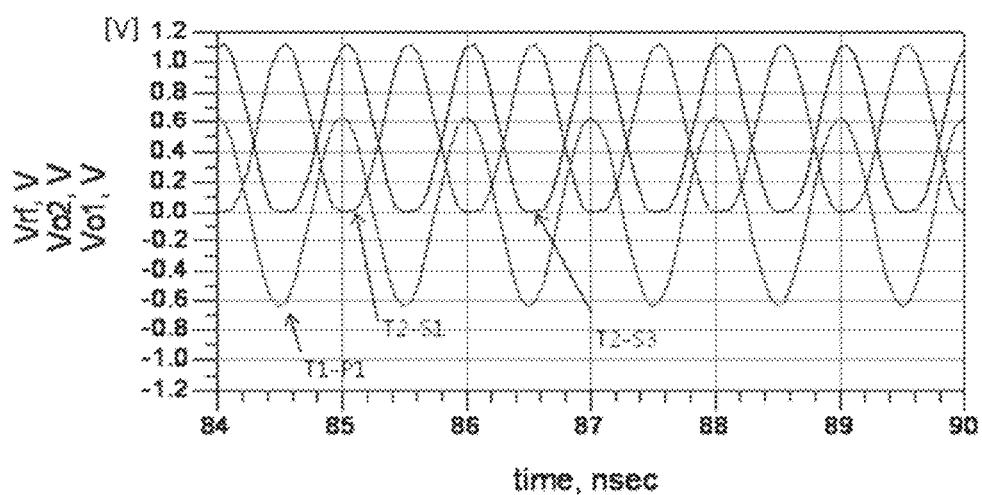
Figure 14:
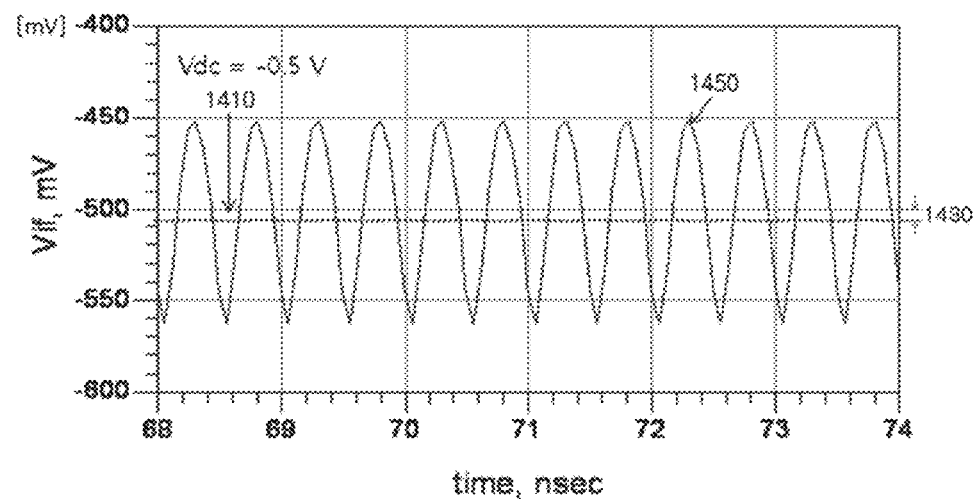
FIGS. 14 and 15 are graphs illustrating a waveform of a signal measured at an output terminal of the diode double balanced mixer in accordance with the embodiment of the present invention.
Figure 15:
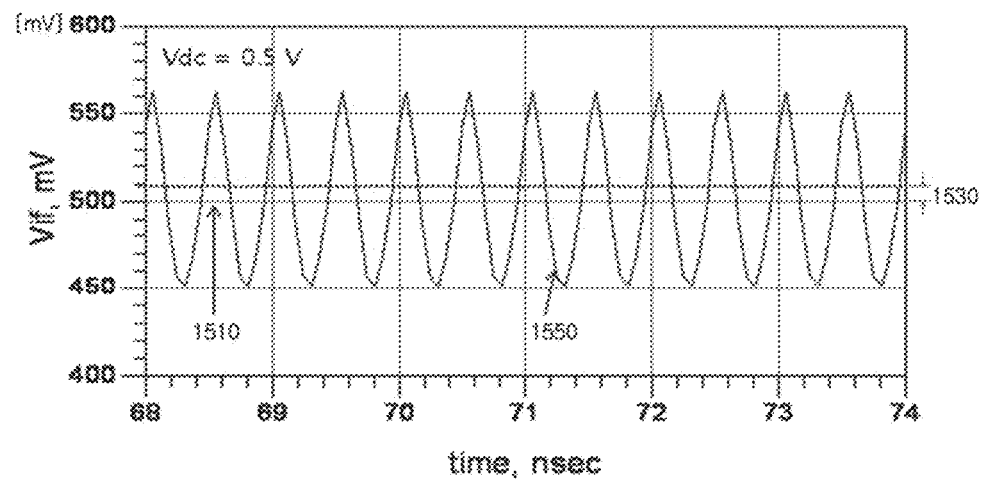

FIGS. 12 and 13 are graphs illustrating the waveform of the signal measured at the internal terminal of the diode double balanced mixer in accordance with the embodiment of the present invention and FIGS. 14 and 15 are graphs illustrating the waveform of the signal measured at the output terminal of the diode double balanced mixer in accordance with the embodiment of the present invention.

FIG. 12 illustrates voltage waveforms generated at terminal T2-S1 and terminal T2-S3 when a sinusoidal signal of 1 GHz is applied to the first terminal 1110, bias voltage of −0.5 V is applied to the third terminal 1150, and the second terminal 1130 is connected to the ground through the resistor having any value. When the bias voltage of −0.5 V is applied to the third terminal 1150, the diodes D1 and D4 are biased forward through the ground terminal T1-S2 of the transformer T1 and the diodes D2 and D3 are biased reversely.

That is, when the input signal to be detected is input to the first terminal 1110, signals having a phase different from 180° are generated at secondary side terminals T1-S1 and T1-S3 of a transformer T1 and signals having the same frequency as the signals generated at the T1-S1 and T1-S3 terminals are also generated at secondary side terminals T2-S1 and T2-S3 of a transformer T2 through diodes D1 and D4. As a result, operation characteristics of the mixer having the third terminal 1150 to which the square signal of the input signal is output are obtained.

FIG. 14 illustrates the waveform of the signal measured at the third terminal 1150 under the conditions of FIG. 12. FIG. 14 illustrates a bias voltage component 1410, a sine wave 1450 having a frequency twice higher than 1 GHz, and a DC offset (about 10 mV) 1430 of a mixer itself. That is, as described above, it can be confirmed from the graph that the signal output from the third terminal 1150 includes the signal squaring the input signal and the DC component due to the internal and external effects of the mixer.

FIG. 13 illustrates the case in which other conditions are the same as FIG. 12, but the bias voltage applied to the third terminal 1150 is +0.5 V. As illustrated in FIG. 13, when the bias voltage is set to be +0.5 V, the diodes D2 and D3 become forward biased and the diodes D1 and D4 become reverse biased. Even in this case, the signal having the same frequency as the signal generated at the secondary side terminals T1-S1 and T1-S3 of the transformer T1 is generated at the secondary side terminals T2-S1 and T2-S3 of the transformer T2 through the diodes D2 and D3 and therefore, the operation characteristics of the mixer to which the square signal of the input signal to the third terminal 1150 is output can be obtained FIG. 15 illustrates the waveform of the signal measured at the third terminal 1150 under the conditions of FIG. 13. As described in FIG. 14, the signal output from the third terminal 1150 includes a sine wave 1550 having a frequency of 2 GHz that is a signal squaring the input signal, a bias voltage component 1510, and a DC offset 1530 of a mixer itself. However, a bias direction of the diode is on the contrary to the case of FIG. 14 and therefore, when comparing with FIG. 14, the inverted waveform and phase are illustrated.

Figure 16:
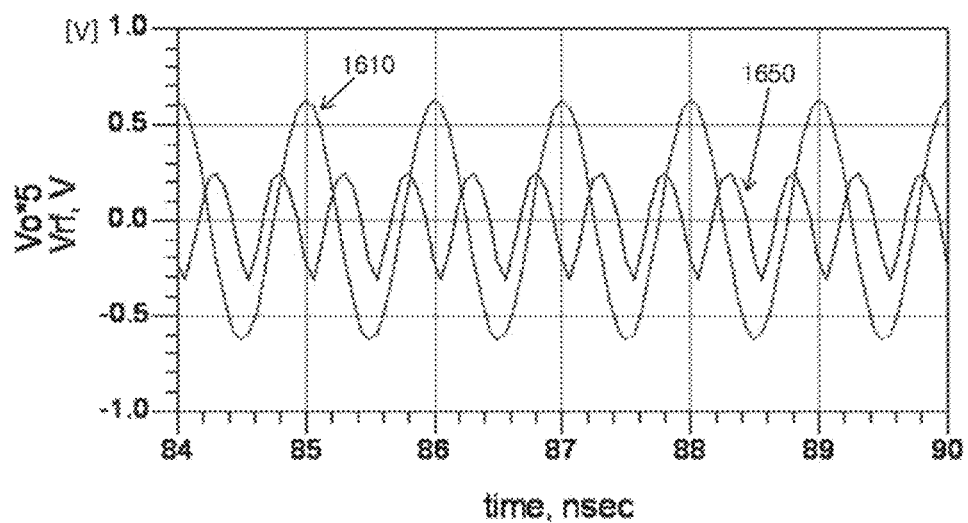
FIG. 16 is a graph illustrating a waveform of a signal input and output to and from the envelope detector in accordance with the embodiment of the present invention.

FIG. 16 is a graph illustrating a waveform of a signal input and output to and from the envelope detector in accordance with the embodiment of the present invention. The graph of FIG. 16 illustrates a sine wave 1610 of 1 GHz input to the first terminal of the mixer and a signal 1650 output from the DC blocking capacitor of the envelope detector in accordance with the embodiment of the present invention. As illustrated in FIG. 16, when the signal passes through the DC blocking capacitor, it can be appreciated that the bias voltage and the DC offset component illustrated in FIGS. 14 and 15 are removed and only the signal having a frequency twice higher than that of the input sine wave is output.

Therefore, the envelope detector in accordance with the embodiment of the present invention can implement the operation characteristics of the mixer in accordance with the related art without using the local oscillator or adding the separate signal and can save costs and can be appropriate to miniaturize the receiver.

As set forth above, in accordance with the embodiments of the present invention, it is possible to provide the envelope detector having the simple structure while having the good receiving sensitivity and the wide dynamic range characteristics.

Further, in accordance with the embodiments of the present invention, it is possible to detect the envelope of the modulated signal without transmitting the carrier signal in the transmitter and generating the separate signal in the receiver, thereby saving the costs consumed to implement the transceiver.

The present invention will be apparent to those skilled in the art that substitutions, modifications and variations can be made without departing from the spirit and scope of the invention and therefore, is not limited to the aforementioned embodiments and the accompanying drawings.

What is claimed is:

1. An envelope detector for detecting an envelope of a digital modulation signal, comprising:
   a mixer configured to receive the digital modulation signal and output a square signal squaring the digital modulation signal when being applied with bias voltage, wherein the mixer comprises:
   a first terminal configured to receive the digital modulation signal;
   a second terminal configured to be connected to a ground through a resistor or to be opened; and
   a third terminal configured to output the square signal when being applied with the bias voltage;
   a bias voltage applying unit configured to apply the bias voltage to the mixer; and
   a DC blocking capacitor configured to be connected to the mixer to block DC component included in the square signal.

2. The envelope detector of claim 1, wherein the bias voltage applying unit includes:
   a power supply unit configured to supply DC power to the mixer through the third terminal;
   a capacitor configured to remove harmonic waves; and
   a choke coil.

3. The envelope detector of claim 1, wherein the mixer is a diode double balanced mixer.

4. The envelope detector of claim 1, further comprising a low pass filter configured to receive a square signal of which the DC component is blocked and remove a high frequency component of the square signal of which the DC component is blocked.

5. The envelope detector of claim 4, further comprising: a decision unit configured to recover a transmitting signal from a signal passing through the low pass filter using a threshold level.

* * * * *